(12) United States Patent
Morestin et al.

(10) Patent No.: US 10,580,807 B2
(45) Date of Patent: Mar. 3, 2020

(54) COLOR PIXEL AND RANGE PIXEL COMBINATION UNIT

(71) Applicants: STMicroelectronics, Inc., Coppell, TX (US); STMICROELECTRONICS (ALPS) SAS, Grenoble (FR)

(72) Inventors: Frederic Morestin, Santa Clara, CA (US); Alexandre Balmefrezol, Sassenage (FR); Rui Xiao, San Jose, CA (US)

(73) Assignees: STMicroelectronics, Inc., Coppell, TX (US); STMICROELECTRONICS (ALPS) SAS, Grenoble (FR)

( * ) Notice: Subject to any disclaimer, the term of this patent is extended or adjusted under 35 U.S.C. 154(b) by 0 days.

(21) Appl. No.: 15/792,556

(22) Filed: Oct. 24, 2017

(65) Prior Publication Data

US 2019/0123075 A1 Apr. 25, 2019

(51) Int. Cl.
| | |
|---|---|
| H04N 5/369 | (2011.01) |
| H01L 27/146 | (2006.01) |
| H04N 9/04 | (2006.01) |
| H04N 5/355 | (2011.01) |
| G01S 1/00 | (2006.01) |

(52) U.S. Cl.
CPC ......... *H01L 27/14603* (2013.01); *G01S 1/00* (2013.01); *H01L 27/14607* (2013.01); *H01L 27/14645* (2013.01); *H04N 5/355* (2013.01); *H04N 5/36965* (2018.08); *H04N 9/045* (2013.01); *H04N 9/04559* (2018.08); *H04N 9/04561* (2018.08); *H04N 2209/045* (2013.01); *H04N 2209/047* (2013.01)

(58) Field of Classification Search
CPC ...................................................... H04N 5/355
USPC .................................................. 348/46, 278
See application file for complete search history.

(56) References Cited

U.S. PATENT DOCUMENTS

| | | | |
|---|---|---|---|
| 7,375,803 | B1 | 5/2008 | Bamji |
| 7,560,679 | B1 | 7/2009 | Gutierrez |
| 2003/0063185 | A1 | 4/2003 | Bell |
| 2004/0169749 | A1 | 9/2004 | Acharya |
| 2008/0266431 | A1* | 10/2008 | Ohyama ................. G01S 7/481 348/294 |
| 2010/0033611 | A1 | 2/2010 | Lee et al. |
| 2010/0073462 | A1* | 3/2010 | Lee ........................ H04N 5/347 348/46 |
| 2011/0001205 | A1 | 1/2011 | Sul et al. |
| 2011/0260059 | A1 | 10/2011 | Jiang et al. |
| 2012/0236121 | A1 | 9/2012 | Park et al. |
| 2013/0020463 | A1 | 1/2013 | Lee et al. |
| 2013/0119438 | A1 | 5/2013 | Kim et al. |
| 2013/0120623 | A1 | 5/2013 | Kim |
| 2013/0335725 | A1 | 12/2013 | Hardegger et al. |
| 2014/0138519 | A1 | 5/2014 | Wang et al. |

(Continued)

*Primary Examiner* — Joel W Fosselman
(74) *Attorney, Agent, or Firm* — Seed IP Law Group LLP

(57) ABSTRACT

The present disclosure is directed to an image sensor including a pixel array of both range pixels and color pixels. Each range pixel (or range pixel area) may be associated with multiple adjacent color pixels, with each side of the range pixel immediately adjacent to at least two color pixels. The association between the range pixels and the color pixels may be dynamically configurable. The readings of a range pixel(s) and the associated color pixels may be integrated together in the generation of a 3D image.

20 Claims, 7 Drawing Sheets

(56) References Cited

U.S. PATENT DOCUMENTS

| | | |
|---|---|---|
| 2014/0217474 A1 | 8/2014 | Lee et al. |
| 2014/0346361 A1* | 11/2014 | Wang ...................... G06F 3/042 250/349 |
| 2015/0001664 A1 | 1/2015 | Van Der Tempel et al. |
| 2016/0181295 A1 | 6/2016 | Wan et al. |
| 2016/0181298 A1 | 6/2016 | Wan et al. |
| 2016/0240579 A1 | 8/2016 | Sun et al. |
| 2018/0047182 A1* | 2/2018 | Gelb ...................... G06T 19/00 |

* cited by examiner

| R | Gr | R | Gr | R | Gr | R | Gr | R | Gr | R | Gr |
|---|----|---|----|---|----|---|----|---|----|---|----|
| Gb | B | Gb | B | Gb | B | Gb | B | Gb | B | Gb | B |
| R | Gr | R | Gr | R | Gr | R | Gr | R | Gr | R | Gr |
| Gb | B | Gb | B | Gb | B | Gb | B | Gb | B | Gb | B |
| R | Gr | R | Gr | | | | | R | Gr | R | Gr |
| Gb | B | Gb | B | | | | | Gb | B | Gb | B |
| R | Gr | R | Gr | | $Z_b$ | | | R | Gr | R | Gr |
| Gb | B | Gb | B | | | | | Gb | B | Gb | B |
| R | Gr | R | Gr | R | Gr | R | Gr | R | Gr | R | Gr |
| Gb | B | Gb | B | Gb | B | Gb | B | Gb | B | Gb | B |
| R | Gr | R | Gr | R | Gr | R | Gr | R | Gr | R | Gr |
| Gb | B | Gb | B | Gb | B | Gb | B | Gb | B | Gb | B |

COLOR PIXEL AND RANGE PIXEL COMBINATION UNIT

BACKGROUND

Technical Field

The present disclosure is directed to image sensors with combination pixel units including both color pixels and range pixels and methods of using the same.

Description of the Related Art

Needs for real time 3D imaging in various technology areas such as human-machine interaction, self-driving automobiles, robotics, medical imaging, and visual reality urge the integration of range imaging with traditional 2D color imaging. Among various techniques for range imaging, for example, stereo triangulation, interferometry, laser scanning, etc. Time-of-Flight has been proven to be a feasible technique to achieve real time 3D imaging without costly computation and delay.

Time-of-Flight range imaging measures a depth of a 3D object by calculating a time duration that an emitted light takes to travel to and bounce back from the 3D object. For example, a continuously-modulated invisible light wave, e.g., a laser or an infrared (IR) light beam, is emitted from a light emitting unit and the phase delay between the received bounce-back light and the original emitted light is detected and calculated to determine the depth, i.e. a distance between a Time-of-Flight sensor and the object.

A Time-of-Flight based range/depth pixel (commonly referred to as a "Z" pixel) may include a Single Photon Avalanche Diode (SPAD), which is a p-n junction device biased beyond its breakdown region. A current state of the art SPAD based range pixel has a pixel pitch larger than that of a state of the art color pixel. For example, the state of art pixel pitch of a color pixel is 1.4 µm and the state of art pixel pitch of a SPAD based range pixel is 5.6 µm.

BRIEF SUMMARY

The present disclosure is directed to an array of pixels that can be included in a camera, such as in a mobile phone or a mobile smart device, which allows a user to capture color images and depth information at the same time. For example, the array of pixels can include a range pixel surrounded by a plurality of color pixels. This type of array of pixels can allow a user to take three-dimensional pictures that represent the depth of the object from the camera and the colors of the object being imaged.

An image sensor includes a pixel array of both range pixels and color pixels. Each range pixel (or range pixel area) may be associated with multiple adjacent color pixels, with each side of the range pixel immediately adjacent to at least two color pixels. The association between the range pixels and the color pixels may be dynamically configurable. The readings of a range pixel or pixels and the associated color pixels may be integrated together in the generation of a 3D image.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

FIG. 2B is a plan view of another example combination unit of color pixels and a range pixel;

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure. The drawings are not necessarily drawn to scale and some features are enlarged to provide a more clear view of particular features.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
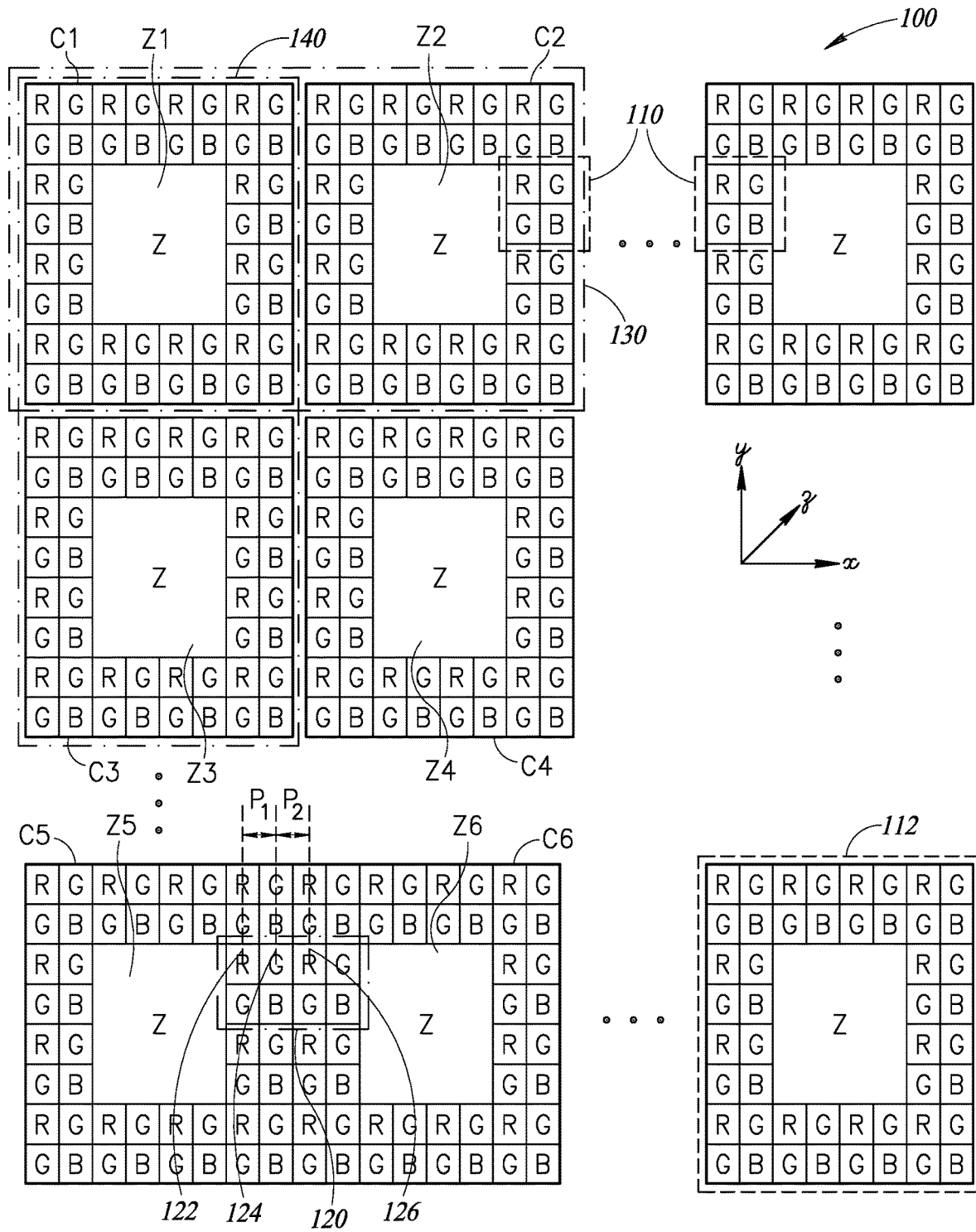
FIG. 1 is a plan view of an example pixel array.

The present disclosure is generally directed to providing an image sensor including a pixel array of both color pixels and range pixels for 3D imaging capacity. An example embodiment of a pixel array 100 is shown in FIG. 1. In this embodiment, pixel array 100 includes a plurality of color pixels R, G, B including, e.g., red (R), green (G) and blue (B) color filters. The color pixels are configured to receive and/or detect color image information of an object, i.e., in the X-Y plane. The color pixels may be arranged in example RGBG matrix patterns 110, each pattern 110 including four color pixels (referred to herein as "color pixel matrix pattern"). Pixel array 100 also includes multiple range pixels (Z) configured to detect depth information of an object, i.e., in the Z-axis. Each range pixel Z may include four sides. Each range pixel Z is surrounded (completely or partially) by a plurality of adjacent color pixels, with each side of the range pixel Z having a same number of at least two immediately adjacent color pixels (four immediately adjacent color pixels for each side of the range pixel Z are shown in the example of FIG. 1).

The range pixels Z and the surrounding color pixels R, G, B, may be associated with one another to achieve 3D image information acquisition. The association may be achieved in hardware implementation, e.g., shared hardware elements for reading out the data sensed by the associated color pixels R, G, B and range pixels Z, and/or the association may be achieved in software implementation, e.g., data acquired from color pixels and associated Z pixels linked in data processing to achieve 3D image information acquisition. In data processing, the readings of a range pixel z and the associated color pixels R, G, B may be integrated to, e.g., generate a 3D image.

For example, as shown in FIG. 1, as identified by dotted block 112, the range pixel Z and 48 adjacent color pixels R, G, B (specifically, 12 R pixels, 12 B pixels and 24 G pixels) are associated to one another as a combination pixel unit (or cluster) 112, referred to herein as "combination unit C". Combination units C1, C2, C3 each include range pixel Z1, Z2, Z3, respectively and 48 color pixels surrounding the respective range pixel Z. FIG. 1 shows, for illustrative purposes, a combination unit C, e.g., C1, C2, C3, with a darkened edge line and having a space from an adjacent combination unit C. However, such darkened edge and the illustrated space does not necessarily indicate any structural difference and/or meaning. For example, color pixels of adjacent combination units C may be adjacent to one another in a same manner as within a color pixel matrix pattern and/or within a combination unit. For example, as shown in dotted frame 120 of FIG. 1, color pixels in the two adjacent combination units C5, C6 (i.e., associated with range pixels Z5 and Z6, respectively) may be structurally arranged similarly within the respective color pixel matrix pattern or beyond the relevant color pixel matrix pattern. That is, the pixel pitch P1 between the R pixel 122 and G color pixel 124 of combination unit C5 is the same (or designed to be substantially the same) as pixel pitch P2 between the adjacent G pixel 124 and R pixel 126 each of adjacent combination units C5 and C6, respectively.

Further, the color pixels R, G, B and range pixels Z may be electrically and/or communicatively arranged in a manner that the association between color pixels R, G, B and range pixels Z may be dynamically configurable (adjustable). For illustrative example, with regard to the two RGB color pixel matrix patterns in the illustrative frame 120, their respective color pixels RGBG may be together associated a different one of range pixels Z5 and Z6 respectively or may be all associated to one of the range pixels Z5 or Z6. Further, it is not necessary that the R, G, B color pixels in a color pixel matrix pattern (RGBG pattern) be together associated to a range pixel Z. In various configurations and/or data reading patterns, color pixels in a RGBG matrix pattern may be associated with different (adjacent) range pixels Z. For illustrative example, for the left RGBG matrix pattern in the illustrative frame 120, it is possible that the R and one of G color pixels are associated to range pixel Z5 and the B and the other G color pixels are associated with range pixel Z6.

Further, the range pixels Z and the associated color pixels (i.e., the combination units C) may be further associated for various application scenarios. For example, combination unit C1 (range pixel Z1 and the associated 48 color pixels R, G, B) and combination unit C2 (range pixel Z2 and the associated 48 color pixels R, G, B) may be associated together, as shown with dotted frame 130, in, e.g., data reading and processing. For example, the depth or distance readings of range pixels Z1 and Z2 may be averaged and the average depth value may be associated to the color pixels readings of the 96 (48+48) color pixels R, G, B associated with range pixels Z1 and Z2. Similarly, combination units C1 and C3 may be associated together, as shown with dotted frame 140. Further, combination units C1, C2, C3, C4 may be associated together in some 3D imaging applications. For example, the readings of range pixels Z1, Z2, Z3, Z4 may be averaged to be associated with all 192 (48×4=192) color pixels R, G, B of combination units C1, C2, C3, and C4. Such association may be used in some applications that require lower definition for depth information to, e.g., save processing overhead.

FIG. 1 shows, as an illustrative example, that a single range pixel Z, e.g., Z1, is surrounded by the plurality of color pixels adjacent to each side of the single range pixel. This is not limiting and it is possible that a range pixel area of multiple range pixels be surrounded by and associated with a plurality of color pixels to constitute a combination unit C, e.g. C1. Namely, a single range pixel Z is a specific example of a range pixel area, both of which are included in the disclosure. Further, a range pixel (area) Z may be partially surrounded by color pixels, i.e., one or more sides of the range pixel area may include no adjacent color pixels. For example, a range pixel Z may be positioned at an edge of an image sensor pixel array.

In FIG. 1, a Bayer filter mosaic of RGBG is used as an example of a color pixel matrix pattern. Other filter matrix patterns are also possible and included in the disclosure. For example, the color pixels may be arranged in one or more of "Panchromatic" patterns, in CYGM (cyan, yellow, green, magenta) patterns, RGBE (red, green, blue, emerald) patterns, and/or "X-Trans" patterns, which are all included in the disclosure.

Figure 2A:
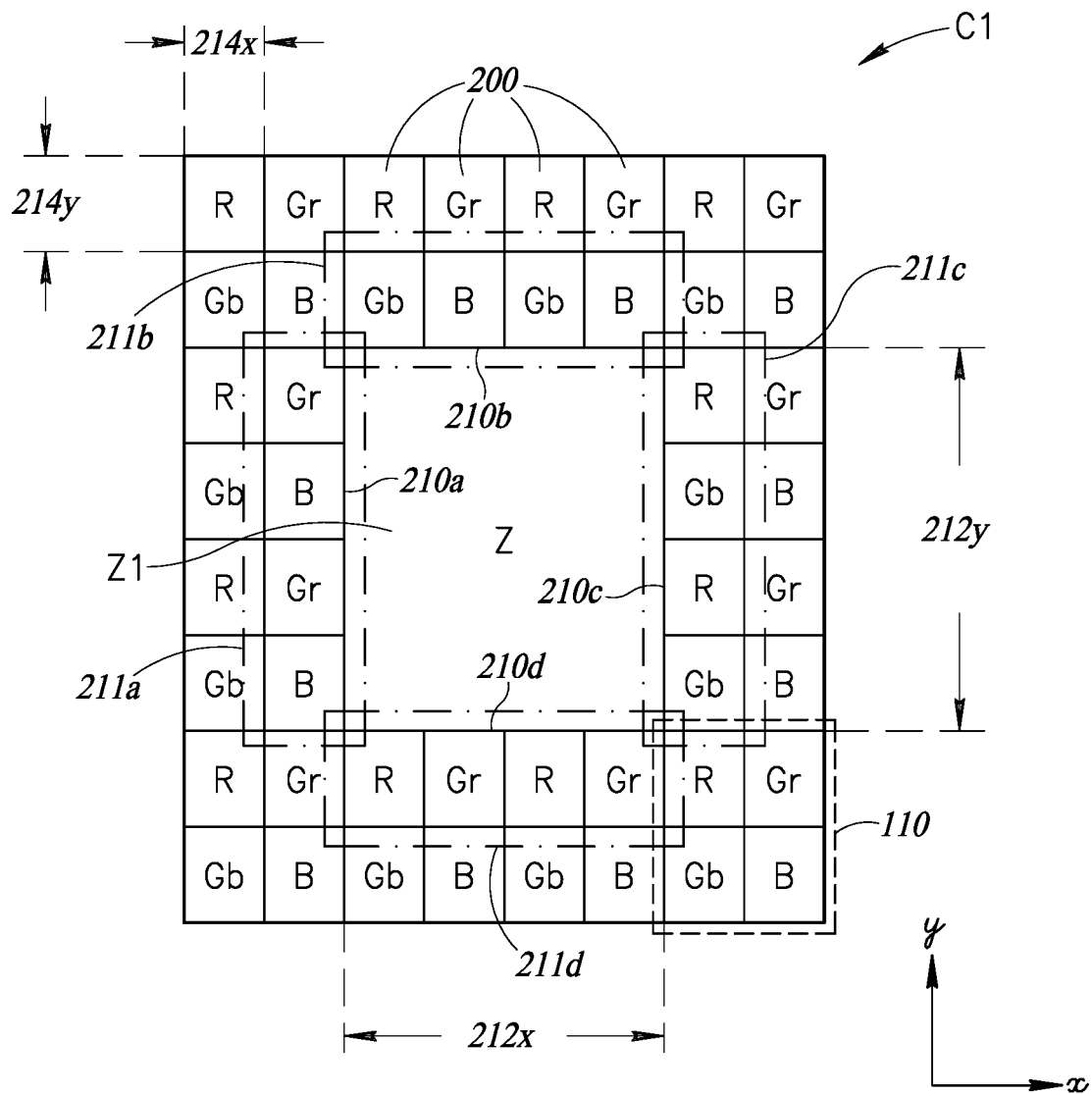
FIG. 2A is a plan view of an example combination unit of color pixels and a range pixel.

Referring now to FIG. 2A, an enlarged view of an example combination unit C1 of FIG. 1 is shown. As shown in FIG. 2, range pixel Z1 is surrounded by 48 color pixels 200. Range pixel Z1 includes four sides 210a, 210b, 210c, 210d, each having a same number of the color pixels, such that the Z1 area is square. Here in FIG. 2A, for example, each side 210a, 210b, 210c, 210d each has four immediately adjacent color pixels. Dotted frames 211a, 211b, 211c, 211d identify color filter combinations of four color pixels 200 that are immediately adjacent the sides 210a, 210b, 210c, 210d of the range pixel Z1, respectively. The minimum number of color pixels 200 adjacent to each of the four sides is two.

In the example as shown in FIG. 2A, for the two adjacent sides 210a and 210b of range pixel Z1, the color filter combinations 211a, 211b of the immediately adjacent color pixels 200 are the same, i.e. GBGB. For the two adjacent sides 210c and 210d, the color filter combinations 211c, 211d of the immediately adjacent color pixels 200 are the same, i.e. RGRG.

In an example, the 48 adjacent color pixels 200 (R, G, B) are arranged in two rings around the range pixel Z.

Further, the 48 adjacent color pixels 200 include 12 RGBG color pixel matrix patterns 110. These color pixel matrix patterns 110 are arranged in one ring around the range pixel Z. As shown in FIG. 2A, for the green color pixels G in the 12 color pixel matrix patterns, it is possible to include color filter differentiation between Gr and Gb because Gr and Gb filters may be formed through two separate processes. Such color filter differentiation or difference may be maintained or may be corrected, e.g., through color collection or black level compensation procedures. Such color filter differentiation is shown for illustrative purposes and does not change the scope of the disclosure.

Figure 2C:
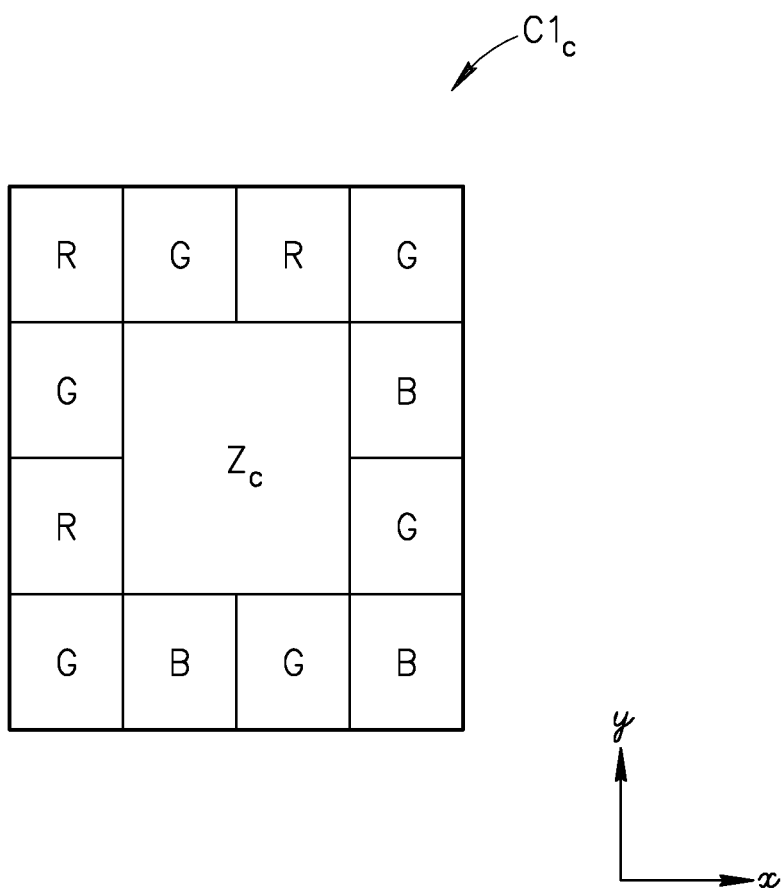
FIG. 2C is a plan view of another example combination unit of color pixels and a range pixel.

The range pixel Z1 may have a first dimension 212$x$, e.g., along the X-axis and a second dimension 212$y$, e.g., along the Y-axis. The first dimension 212$x$ may be substantially equal to the second dimension 212$y$, with both referred to generally as a range pixel side dimension 212. Each color pixel R, G, B may include a third dimension 214$x$ along the X-axis and a fourth dimension 214$y$ along the Y-axis. The third dimension 214$x$ may be substantially equal to the fourth dimension 214$y$, with both referred to generally as a color pixel side dimension 214. As shown in FIG. 2A, the range pixel side dimension 212 is substantially equal to four times the color pixel side dimension, regardless of direction, i.e., either the X-axis or the Y-axis. Other relative sizes between the range pixel side dimension 212 and the color pixel side dimension 214 are also possible and included in the disclosure. For example, the range pixel side dimension 212 may be about two times the color pixel side dimension 214, as shown in FIG. 2C.

In the example embodiment of FIG. 2A, the combination unit C1 in overall covers a color pixel area of 8×8 (8 color pixels by 8 color pixels). The pixel array including uniformly such 8×8 combination units of range pixels Z and color pixels R, G, B will fit and correspond perfectly for a 1.2 Mpix RGB camera image sensor (of 1280×960 pixel resolution).

Referring now to FIG. 2B, another example combination unit C1$_b$ is shown. In example combination unit C1$_b$, range pixel Z$_b$ is surrounded by 128 color pixels, which includes 32 RGB color pixel matrix patterns and are arranged in a pattern of four rings around the range pixel Z$_b$. Combination unit C1$_b$ in overall covers a color pixel area of 12×12. A pixel array including uniformly such 12×12 combination units C1$_b$ of range pixels Z$_b$ and color pixels R, G, B will fit a high definition (HD) camera (1920×1080 pixel resolution) with a 640×360 combination unit matrix. For a 2220×1248 pixel resolution camera (custom array size with 16/9 aspect ratio), a 740×416 combination unit matrix will perfectly fit.

The rest of combination unit C1$_b$ may be identical or very similar to example combination unit C1 of FIG. 2A. Actually combination unit C1$_b$ may be viewed as combination unit C1 with an additional outer ring of 20 color pixel matrix patterns of RGBG (or two additional outer rings of 80 color pixels R, G, B). In other scenarios, depending on 3D imaging application requirements, the combination units C1, C1$_b$ of FIGS. 2A and 2B may be modified to include more or less color pixels R, G, B. For example, combination unit C1$_b$ of FIG. 2B may be modified to include another outer ring of 104 color pixels R, G, B of 26 color pixel matrix patterns RGBG.

The choice of various number of color pixels R, G, B to be associated to a single range pixel (a range pixel area) Z may be made based on the relative emphasis on either the color information or the depth information of a 3D imaging application. For example, between the example combination units C1 and C1$_b$ of FIGS. 2A and 2B, a pixel array of combination units C1 will generate more refined depth information at the cost of color information, while a pixel array of combination units C1$_b$ will maintain more color information with coarser depth information. Therefore, depending on whether color information or depth information is more required for a 3D imaging application, choices between the example combination unit C1 or C1$_b$ may be made for a pixel array or a portion of a pixel array.

Referring now to FIG. 2C, another example combination unit C1$_c$ is shown. In combination unit C1$_c$, range pixel Z$_c$ is surrounded by 12 color pixels (3 R, 3 B, and 6 G), with each side of the range pixel Z$_c$ being immediately adjacent to 2 color pixels. The side dimension of the range pixel Z$_c$ is about two times in size of the side dimension of the associated color pixels R, G, B in a same direction (X-axis direction or Y-axis direction). Namely, range pixel Z$_c$ in FIG. 2C includes a surface area about four times in size of a surface area of an adjacent color pixel R, G, B.

As shown in FIG. 2C, the color pixels R, G, B are not arranged in matrix patterns and are overall associated with range pixel Z in data processing for, e.g., the 3D image generation. Range pixel Z$_c$ of combination unit C1$_c$ may possibly be associated with more color pixels, which is also included in the disclosure. For example, there may be another outer ring of 20 color pixels R, G, B adjacent to the current 12 color pixels of combination unit C1$_c$ and the total 32 color pixels R, G, B may include 8 RGBG color pixel matrix patterns.

Figure 3:
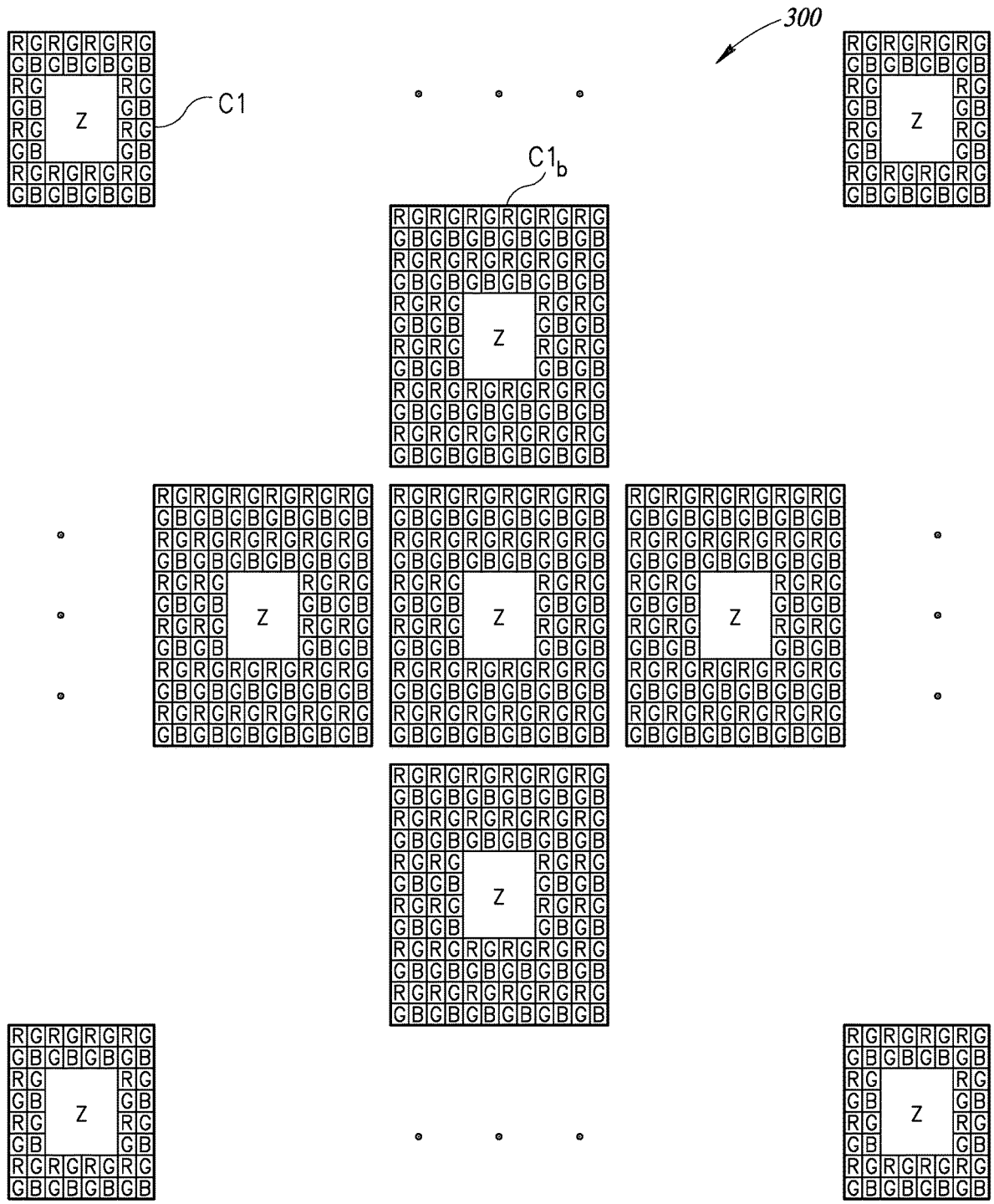
FIG. 3 is a plan view of a pixel array including various combination units of color pixels and range pixels.

Referring now to FIG. 3, a conceptual view of pixel array 300 is shown. As shown in FIG. 3, pixel array 300 may include a plurality of combination units each including a range pixel area Z and a plurality of associated color pixels R, G, B. Pixel array 300 may include different combination units at different locations of the array based at least in part on the balancing test between depth information and color information for different locations of the array. For example, as shown in FIG. 3, combination units C1$_b$ of FIG. 2B are arranged in the center regions of pixel array 300, while combination units C1 of FIG. 2A are arranged in the edge regions of pixel array 300. As such, pixel array 300 balances toward color information in the center regions of a 3D image and balances toward depth information in the edge regions of the 3D image. Other configurations in arranging different combination units C of range pixels Z associated with different numbers of adjacent/surrounding color pixels R, G, B are also possible and included in the disclosure.

As described herein, the association between range pixels Z and color pixels R, G, B may be dynamically reconfigurable. The reconfiguration may be implemented though hardware and/or software solutions in data processing.

Figure 4:
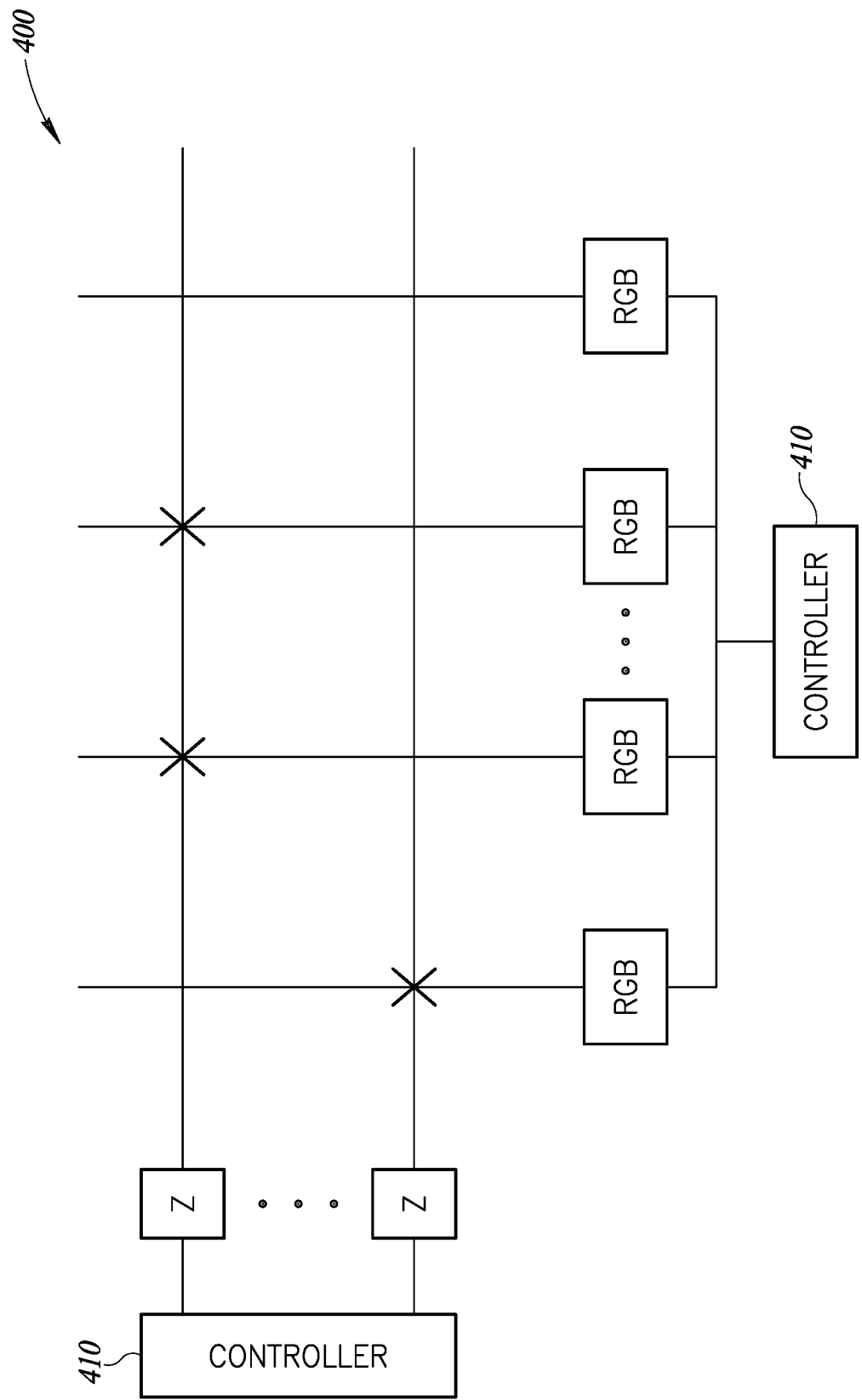
FIG. 4 is a schematic view of a data processing configuration scheme of color pixels and range pixels.

Referring to FIG. 4, a schematic view 400 of a control of the association between range pixels Z and color pixels R, G, B is shown. A controller 410 may be communicatively and/or electrically coupled to color pixels R, G, B and/or range pixels Z to control the association between/among a range pixel(s) Z and adjacent color pixels R, G, B, schematically shown as a crossing "×" in FIG. 4. Controller 410 may be residing on a data processing unit of an imaging application or may be a separate unit communicatively coupled to a data processing unit of an imaging application. The data processing units maybe processors, microprocessor, or other transistor based circuitry that can receive, process, and transmit data. Controller 410 may dynamically control that a color pixel matrix pattern (e.g., RGBG) be associated with a range pixel Z or may control that a single color pixel R, G, B be associated with a range pixel Z. Further, controller 410 may control that all color pixels R, G, B be not associated with range pixels Z such that the image sensor acquires data for 2D images instead of 3D images. Furthermore, controller 410 may also control that two or more adjacent range pixels Z be associated together in the processing of depth information and the associated color image information.

The control functions of controller 410 may be achieved through hardware implementations and/or software implementations. For example, in hardware implementation, controller 410 may apply control signals to transistors to control the reading of the range pixels Z in relation to the associated color pixels R, G, B. In software implementation, controller 410 may link the readings of a range pixel Z with the associated color pixels R, G, B in the processing of the image data. Other approaches to implement controller 410 to dynamically control the association between range pixels Z and color pixels R, G, B are also possible and included in the disclosure.

Figure 5:
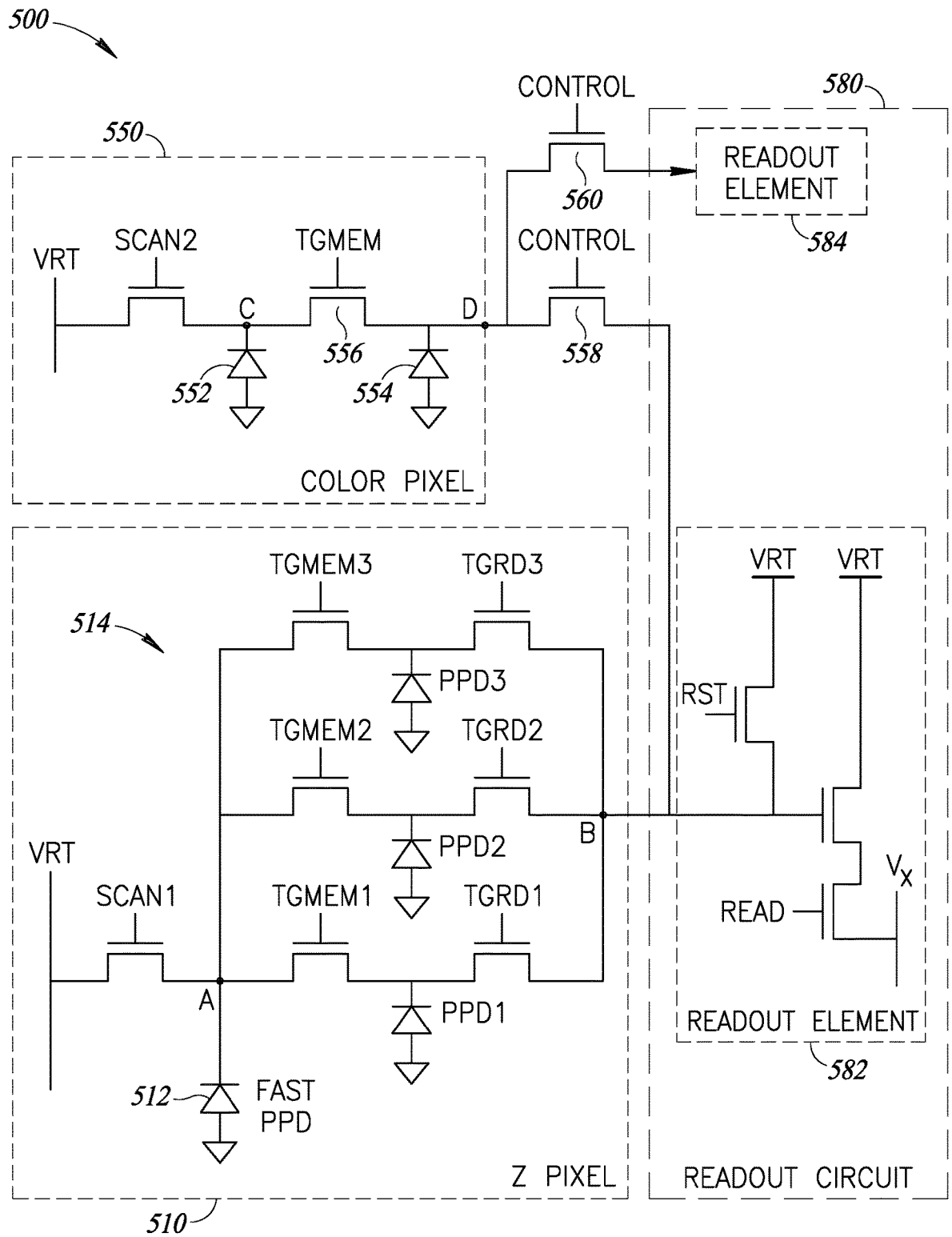
FIG. 5 is a circuit diagram of an example configuration of a color pixel circuit and a range pixel circuit.

Referring to FIG. 5, an example circuit implementation of a range pixel z and an associated color pixel R/G/B is shown. As shown in FIG. 5, example circuit implementation 500 includes an example range pixel circuit 510, an example color pixel 550 (which can represent a plurality of color pixels), an example readout circuit 580 including a shared readout element 582 and another readout element 584.

Range pixel circuit 510 includes a fast pinned photodiode (FAST PPD) 512, e.g., a pinned single photo avalanche diode (SPAD), coupled to a 3-bin demodulation unit 514. Demodulation unit 514 includes three in-parallel transfer-to-memory gates (TGMEM1, TGMEM2, TGMEM3) modulated (through gate control signals) with an out-of-phase angle of 120° among one another, three diodes (e.g., same type of pinned photodiode as FAST PPD 512) coupled to the gates TGMEM1, TGMEM2, TGMEM3, respectively, and functioning as memories to save the electrical potential at node "A", and three transfer-to-readout gates TGRD1, TGRD2, TGRD3 coupled to the memory photodiodes PPD1, PPD1, PPD3, respectively, to selectively output the saved electrical potential information of the three diodes at node "B".

Other demodulation configurations are also possible and included in the disclosure. For example a 4-bin demodulation unit (with 90° out-of-phase angles) or a 2-bin demodulation unit (with 180° out-of-phase angles) are all possible configurations.

In operation, demodulation unit 514 is configured to sample the incoming modulated non-visible light wave, e.g., IR beam, three times per modulation period. Each sampling saves the photo-generated electrical potential at node "A" for the one third fraction of the modulation period under, e.g., a modulation frequency of 20 MHz. The saved sampled readings will be fed to a data processing unit through readout circuit 580 and the modulation signal will be reconstructed through data processing based on the sampled readings. Further elaboration of the data processing details are not required for the appreciation of the disclosure and may be omitted for simplicity purposes.

Color pixel circuit 550 may include a photo diode, e.g., a pinned photo diode PPD 552, a transfer-to-memory gate TGMEM 556, and another photo diode 554, e.g., similarly a PPD. TGMEM 556 may function as an electronic shutter to control the electrical potential at node "C" to be transferred and saved in PPD 554, ready for readout at note "D". Control gates (CONTROL) 558 and 560 may control the reading at node "D" to be fed into readout element 582 that is coupled to range pixel circuit 510 or readout element 584 that is coupled to another range pixel Z (not shown). Therefore, through the control signals to transistors 558 and/or 560, controller 410 may control whether color pixel circuit 550 is associated to range pixel 510 or another range pixel. Exposure to non-visible light, e.g., IR, of FAS PPD 512 may be controlled by signal SCAN 1 and exposure to visible light of PPD 552 may be controlled by signal SCAN 2. In an example, signals SCAN 1 and SCAN 2 may alternatively turn on/turn off FAST PPD 512 of range pixel 510) or PPD 552 of color pixel 550). In another example, the exposure of FAST PPD 512 and the PPD 552 may overlap, although the turning on/off of the FAST PPD 512, in the scale of 20 MHz modulation frequency, is much more frequently than the turning on/off of the PPD 552.

The sequential order of obtaining the readings of the range pixels Z, e.g., range pixel 510 at node "B" and the readings of associated colors pixels R, G, B, e.g., color pixel 550 at node "D" may follow any now or future developed solutions and all are included in the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
an image sensor that includes:
a range pixel area including four sides of a same size; and
a plurality of color pixels adjacent to the range pixel area, each of the four sides having a separate set of color pixels each immediately adjacent to the side, each of the separate set of color pixels having a same number of at least four color pixels, none of the separate set of color pixels overlapping with another separate set of color pixels of the four sides.

2. The image sensor of claim 1, wherein a combination of color filters of the plurality of color pixels adjacent to two adjacent sides of the range pixel area are the same.

3. The image sensor of claim 1, wherein the range pixel area and the plurality of color pixels adjacent to the range pixel area are associated to one another to form a combination pixel unit.

4. The image sensor of claim 3, wherein the plurality of adjacent color pixels includes forty eight color pixels arranged into twelve color pixel matrix patterns surrounding the range pixel area.

5. The image sensor of claim 4, wherein the surrounding color pixel matrix patterns and the range pixel area together cover an 8×8 pixel surface area.

6. The image sensor of claim 3, wherein the plurality of adjacent color pixels includes one hundred and twenty eight color pixels arranged into thirty two color pixel matrix patterns surrounding the range pixel area.

7. The image sensor of claim 6, wherein the surrounding color pixel matrix patterns and the range pixel area together cover a 12×12 pixel surface area.

8. The image sensor of claim 3, wherein the plurality of color pixels are arranged in matrix patterns each including four color pixels of at least three different color filters.

9. The image sensor of claim 1, wherein the range pixel area includes a surface area about four times in size of a surface area of one of the color pixels of the plurality of color pixels.

10. The image sensor of claim 1, further comprising a reading circuit having one or more readout elements, and the range pixel area and the plurality of color pixels being electrically coupled to a same one of the one or more readout elements of the reading circuit.

11. The image sensor of claim 1, further comprising a controller electrically coupled to a readout element of the image sensor and configured to control association of the range pixel area and one or more the plurality of color pixels.

12. The image sensor of claim 1 wherein a plurality of additional range pixel areas are positioned in a pattern that every two immediately adjacent additional range pixel areas are spaced with a uniform number of color pixels in between.

13. The image sensor of claim 1, wherein the range pixel area includes a single range pixel.

14. The image sensor of claim 13, wherein the single range pixel includes a width that is substantially at least four times of a width of one of the color pixels of the plurality of color pixels.

15. A pixel array of an image sensor, comprising:
a first range pixel having four sides of a same first size; and
a first plurality of color pixels arranged in at least two rings around the first range pixel, a first ring among the at least two rings being immediately adjacent to the first range pixel and including four separate sets of color pixels, each of the four separate sets of color pixels having a same number of at least four color pixels immediately adjacent to a separate one of the four sides of the first range pixel, none of the four separate sets of color pixels overlapping with another separate set of color pixels of the four separate sets of color pixels.

16. The pixel array of claim 15, wherein the first plurality of color pixels includes 128 color pixels arranged in a pattern of four rings around the first range pixel.

17. The pixel array of claim 15, further comprising a readout circuit element, and wherein the first plurality of color pixels includes 48 color pixels that are electrically coupled to the readout circuit element.

18. The pixel array of claim 15, further comprising:
a second range pixel of substantially a same second size; and
a second plurality of color pixels arranged in at least two rings around the second range pixel, the first range pixel and the first plurality of color pixels form a first combination pixel unit and the second range pixel and the second plurality of color pixels form a second combination pixel unit that is adjacent to the first combination pixel unit.

19. A method, comprising:
reading a range pixel of a pixel array including the range pixel having four sides of a same size and a plurality of color pixels adjacent to the range pixel and associated with the range pixel, each of the four sides having a separate set of color pixels having a same number of at least four of the plurality of color pixels immediately adjacent to the side, none of the separate set of color pixels overlapping with another separate set of color pixels of the four sides;
reading the plurality of color pixels; and
generating a three-dimensional image by integrating the reading of the range pixel with the reading of all of the associated plurality of color pixels.

20. The method of claim 19, wherein the pixel array includes a first range pixel associated with a first number of adjacent color pixels and a second range pixel associated with a second different number of adjacent color pixels.

* * * * *